United States Patent
Zhou et al.

(10) Patent No.: US 6,980,035 B1
(45) Date of Patent: Dec. 27, 2005

(54) AUTO-DETECT LEVEL SHIFTER FOR MULTIPLE OUTPUT VOLTAGE STANDARDS

(75) Inventors: Shi-dong Zhou, Milpitas, CA (US); Gubo Huang, Milpitas, CA (US); Shankar Lakkapragada, San Jose, CA (US); Andy T. Nguyen, San Jose, CA (US); Fariba Farahanchi, Los Gatos, CA (US)

(73) Assignee: Xilinx, Inc., San Jose, CA (US)

( * ) Notice: Subject to any disclaimer, the term of this patent is extended or adjusted under 35 U.S.C. 154(b) by 17 days.

(21) Appl. No.: 10/391,927

(22) Filed: Mar. 18, 2003

(51) Int. Cl.[7] .............................. H03B 1/00; H03K 3/00

(52) U.S. Cl. ........................................ 327/112; 327/333

(58) Field of Search .... 327/108, 112, 333; 326/57–58, 326/81, 91, 87

(56) References Cited

U.S. PATENT DOCUMENTS

| | | | | |
|---|---|---|---|---|
| 6,051,995 A | * | 4/2000 | Pollachek | 326/87 |
| 6,373,285 B1 | * | 4/2002 | Konishi | 326/81 |
| 6,509,765 B1 | * | 1/2003 | Drost | 327/112 |
| 6,512,401 B2 | * | 1/2003 | Clark et al. | 327/112 |
| 6,696,860 B2 | * | 2/2004 | Lim et al. | 326/83 |

* cited by examiner

*Primary Examiner*—Quan Tra
(74) *Attorney, Agent, or Firm*—Justin Liu

(57) ABSTRACT

A technique and circuit implementation are described for automatically detecting a change in a power supply voltage and selectively reconfiguring a circuit for optimized performance at the changed voltage. One application of particular interest is an auto-detect level shifter. The auto-detect level shifter can be used in an output driver and can be automatically enabled if it is needed to optimize performance for various I/O standards, including those that operate at different voltages.

14 Claims, 7 Drawing Sheets

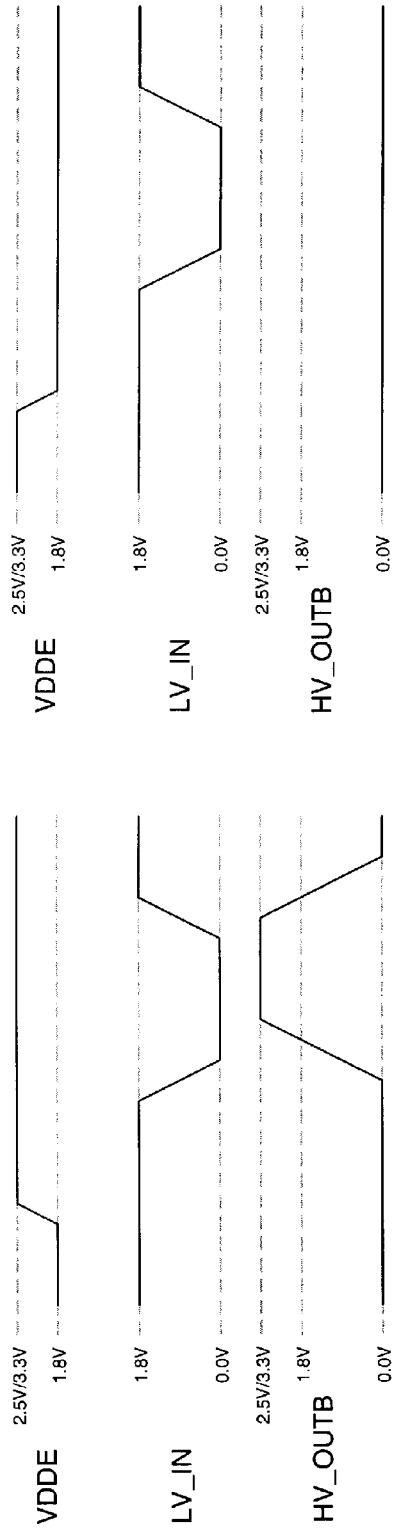
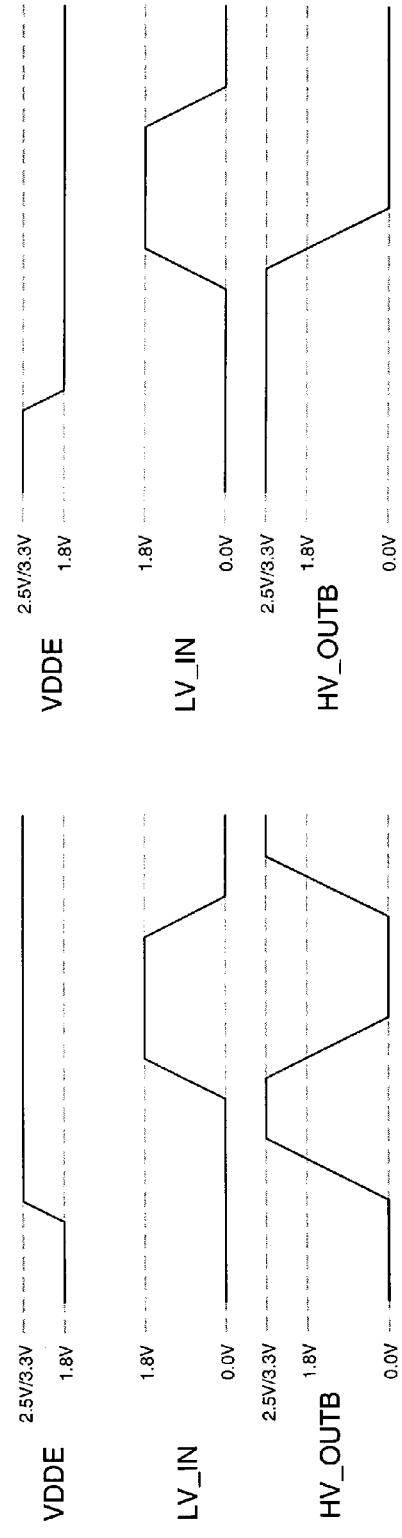

US 6,980,035 B1

AUTO-DETECT LEVEL SHIFTER FOR MULTIPLE OUTPUT VOLTAGE STANDARDS

FIELD OF THE INVENTION

The invention relates to output drivers for integrated circuits. More particularly, the invention relates to a level shifter for an output driver capable of supporting multiple output voltage standards.

BACKGROUND OF THE INVENTION

In order to allow integrated circuits (ICs) from various manufacturers to communicate with each other, various standards have been developed specifying required input/output (I/O) behavior at IC pins. Such I/O standards may provide guidelines or requirements for various signal characteristics such as voltage, current, power and timing. Most systems adhere to at least one such standard, and typically require that devices in the system adhere to the standards being used. Therefore, the ability to meet such I/O standards is a strong commercial advantage.

In particular, designing an IC to meet voltage requirements of an I/O standard can be especially challenging. As IC fabrication processes improve and the minimum feature size on an IC decreases, the voltage level required to operate such ICs also decreases. Current IC processes can typically operate at approximately 1.3V and even lower voltages will be possible soon as technology continues to improve. However, ICs fabricated using these processes often need to be compatible with I/O standards that have not changed and that may require significantly higher voltages. A chip will often be divided into two sections: a core section, which contains the main logical, storage and processing circuitry of the IC, and an I/O section, which contains the circuitry that allows the IC to interface with the system. This division permits different power sources to be used with the different sections. For example, the core can be powered by one voltage source for internal use, VDDI, that is dictated, in part, by the process, while the I/O section can be powered by a different voltage source for external interface, VDDE, that is dictated by the I/O standard. Depending on the particular I/O standard and other IC and system architectural considerations, VDDE can be equal to VDDI, or VDDE can be a voltage level greater than VDDI. For an example, VDDI can be 1.8V while VDDE is 2.5V or 3.3V.

FIG. 1 shows a prior art output driver circuit 100. This circuit, which would be part of the I/O section of an IC, is used to drive an output signal from the IC to another component in the system. The circuit has an input signal IN (node 104), an output enable signal OUT_EN (node 108), and produces an output signal at output PAD (node 170). Note that circuit 100 shows an output driver only, but input receiver circuitry could be added without significantly affecting the output functionality of the output driver. Circuit 100 contains tri-state buffers 121, selectively enabled by a control signal, and inverters 123. Each of the buffers and inverters is connected to an appropriate power supply, either VDDI or VDDE, as shown. Output pullup device 147 of the output driver circuit, a PMOS transistor, operates to pull PAD 170 to a logic high value. Output pulldown device 157, an NMOS transistor, pulls PAD 170 to a logic low. If the OUT_EN signal is not asserted, then the output driver is disabled and output driver circuit 100 is in a high impedance state. If the OUT_EN signal is asserted, then the output at PAD 170 will follow the input at IN. For example, if IN is a logic high, then PAD 170 will also be a logic high, and vice versa.

In the example shown in FIG. 1, the core operates at voltage VDDI, which is lower than voltage VDDE. VDDE can be 2.5V, 3.3V, or any other voltage that is required for the applicable I/O standard. This division of power supplies allows the core to operate more efficiently at a lower voltage, but provides a higher voltage source for driving the output. Note that in this example, GNDI and GNDE are the same voltage level of zero volts. One reason GNDI and GNDE are separated in some ICS is to isolate the core from the I/O and reduce the effects of noise from one section on the other. However, the differences between GNDI and GNDE are not important for the purposes of this discussion and in the examples herein, GNDI and GNDE are both at a voltage level of 0V. Output pullup 147 is connected to VDDE so that when pullup 147 is on, the output at PAD 170 will be driven to VDDE. In order to fully turn off pullup 147 (when the output at PAD 170 should be a logic low), a level shifter 140 is used to drive the gate of pullup 147. Level shifter 140 shifts voltage levels, so, for example, an input having a voltage range from 0V to 1.8V (VDDI) can be shifted to having a range from 0V to 2.5V/3.3V (VDDE). An example of a standard level shifter is shown in FIG. 3. Other level shifting circuits will be known to those of ordinary skill in the art. By shifting the voltage range applied to the gate of PMOS pullup device 147 from VDDI to VDDE, pullup 147 can be fully turned off for better performance. Note that the level shifters used in the examples described herein are inverting level shifters (for example, a logic low input results in a logic high output at the shifted voltage levels, and vice versa); however, a non-inverting level shifter can be substituted (with appropriate circuit modifications) in accordance with an embodiment of the present invention.

In circuit 100, no level shifter is necessary for fully turning off pulldown 157 because GNDI and GNDE are both 0V, and, therefore, pulldown 157 is already fully turned off when the output at PAD 170 should be a logic high. However, since the gate of pulldown 157 is driven only to VDDI (and not to VDDE, which is greater than VDDI) when it is on, pulldown 157 will be slower than pullup 147. This asymmetry causes skew between the rise time and fall time of the signal at PAD 170 when VDDE is greater than VDDI. One solution is to increase the size (width) of pulldown 157 to pull down node 170 more quickly, or to add an additional pulldown device 167 in parallel (which effectively increases the size of pulldown 157).

Since ICs are typically designed for a particular application and for use in a particular system (or type of system), they are usually optimized for the I/O standards of that application and system. Optimization can take into account such factors as speed, timing, power, current, etc. If an IC designed for one standard is used within a system for any other I/O standard, it will perform sub-optimally, and may not work at all. For example, in FIG. 1, additional pulldown 167 speeds up the pulldown path and balances the skew for the case when VDDE is greater than VDDI. If, however, the same IC is used in a system employing a different I/O standard where VDDE equals VDDI, additional pulldown 167 causes the skew to become unbalanced, since the pulldown path is now much faster than the pullup path. In order to use an existing IC in a different system with different I/O standards, it can be necessary to redesign the IC, potentially at great expense.

A programmable logic device (PLD) is a well-known type of digital integrated circuit that can be programmed to perform specified logic functions. In particular, a PLD could be programmed differently depending on the I/O standard in use. One type of PLD, the field programmable gate array (FPGA), typically includes an array of configurable logic blocks (CLBs) and programmable input/output blocks (IOBs). The CLBs and IOBs are interconnected by a programmable interconnect structure. Some FPGAs also include additional logic blocks with special purposes (e.g., DLLs, RAM, multipliers, processors, and so forth).

Another type of PLD is the Complex Programmable Logic Device, or CPLD. A CPLD includes two or more "function blocks" connected together and to programmable I/O resources by an interconnect switch matrix. Each function block of the CPLD includes a two-level AND/OR structure similar to those used in Programmable Logic Arrays (PLAs) and Programmable Array Logic (PAL) devices.

For all of these programmable logic devices, the functionality of the device is controlled by data bits provided to the device for that purpose, and altering the data bits provided can change the configuration of a PLD. In the example shown in FIG. 1, data bit OUT_GROUP_EN at node 106 is used to selectively enable additional pulldown 167. The data bit can be configured to enable additional pulldown 167 when VDDE is greater than VDDI, and disable it when VDDE equals VDDI. The data bits must be stored in some kind of memory, which can be volatile memory (e.g., static RAM cells, as in FPGAs and some CPLDs), non-volatile memory (e.g., FLASH memory, as in some CPLDs), or any other type of memory cell. In any case, in order to program a particular CLB, IOB, function block, or other programmable resource in the PLD, some form of memory must be set aside to control the functionality of the programmable resource. This memory consumes limited resources on the IC by occupying part of the area of the IC and requiring access to an interface for loading the memory with the appropriate configuration data bits.

In addition, such memory can typically only be updated during a configuration phase of the PLD. Once the PLD has been configured and is in full operation, it is difficult to reconfigure the PLD without suspending operation. Normally, the voltage level of VDDE will be established at power-up and will remain constant while the circuit is in use. A change in the I/O voltage supply, which can be necessitated, for example, by a change in the relevant I/O standard or a change in the system architecture, is a relatively rare event that would most likely require a user to power down the system, providing an opportunity to reconfigure the PLD, in order to make the change. A user's particular application, however, may require switching the VDDE power supply "on the fly," that is, while the IC is powered on and in operation. Furthermore, reconfiguring the PLD may involve reprogramming other devices in the system and may require additional design time.

Therefore, a need exists for a way to automatically reconfigure an IC to comply with different I/O standards with a minimal cost in resources. A need also exists for a way to reconfigure a circuit automatically when the voltage of a power supply is changed.

SUMMARY OF THE INVENTION

In accordance with the present invention, an integrated circuit has an auto-shutoff circuit for detecting a change in the voltage level of the power supply. Depending on the change in voltage, certain portions of the integrated circuit can be selectively enabled with no additional input or control needed.

In accordance with the present invention, an output driver has at least one auto-detect level shifter that has an auto-shutoff circuit for selectively enabling the level shifter depending on the power supply voltage being used. The level shifter can be used to selectively enable additional output devices in order to optimize performance of the driver.

BRIEF DESCRIPTION OF THE DRAWINGS

The present invention is illustrated by way of example, and not by way of limitation, in the following figures, in which like reference numerals refer to similar elements.

FIGS. 5A–5D show waveforms representing various inputs and their corresponding outputs of an auto-detect level shifter.

DETAILED DESCRIPTION

The present invention is believed to be applicable to a variety of circuits and systems that use multiple voltage standards. The present invention has been found to be particularly applicable and beneficial for use in connection with PLDs having configurable I/O blocks. While the present invention is not so limited, an appreciation of the present invention is presented by way of specific examples, including an auto-detect level shifter in an output driver. In the following description, numerous specific details are set forth to provide a more thorough understanding of the present invention. However, it will be apparent to one of ordinary skill in the art that the present invention can be practiced without these specific details.

Figure 1:
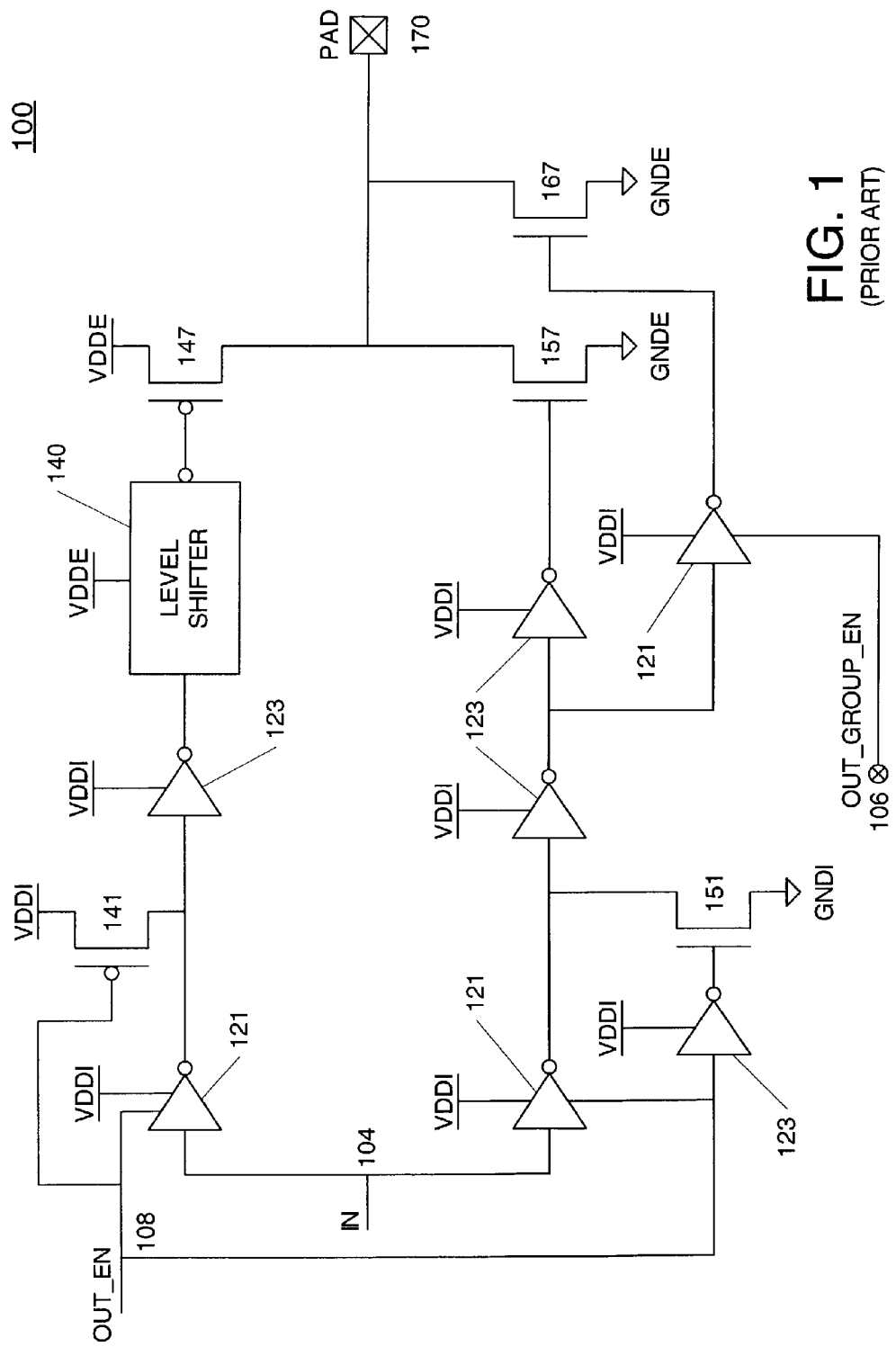
FIG. 1 shows a functional circuit diagram of a prior art output driver.
Figure 2:
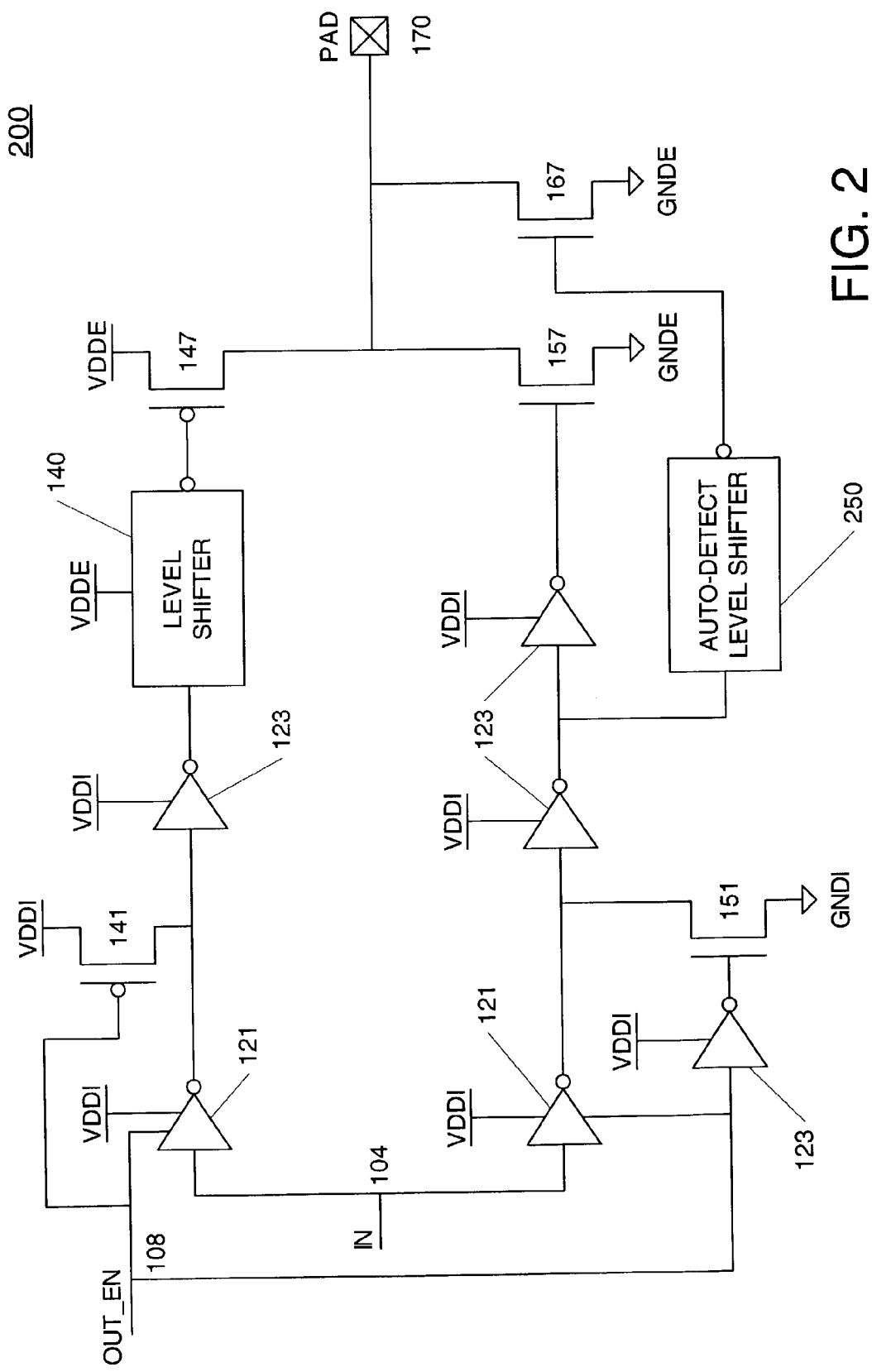
FIG. 2 shows a functional circuit diagram of an output driver in accordance with the present invention.

FIG. 2 shows an output driver circuit 200 that includes an auto-detect level shifter 250 in the pulldown path and controlling the additional pulldown device 167. Auto-detect level shifter 250 can detect the VDDE voltage level and is selectively enabled depending on the VDDE voltage level. When the voltage VDDE is equal to VDDI, there is no need for additional pulldown device 167 to be enabled, so auto-detect level shifter 250 is automatically disabled. When VDDE is greater than VDDI, auto-detect level shifter 250 is automatically enabled, which enables additional pulldown device 167 to speed up the pulldown path and balance the skew. Therefore, output driver circuit 200, including output devices 147 and 157 and with device 167 disabled, can be optimized for the case when VDDE equals VDDI, and the rise time and fall time skew can be minimized. IF VDDE is changed to a higher voltage for compatibility with a different I/O standard, auto-detect level-shifter 250 is automatically enabled, which means additional pulldown device 167 in the pulldown path is also enabled, thereby ensuring optimized performance under the changed conditions.

Thus, in order to use output driver circuit 200 and have optimal performance at different power supply voltage levels, a user merely needs to connect VDDE to the appropriate voltage supply. There is no need to reconfigure the circuit, or the IC in which the circuit is included. There is also no need for any control logic or memory to be incorporated in the circuit as was necessary in circuit 100 (see, e.g., memory bit 106), resulting in a conservation of resources. When VDDE is increased, for example from 1.8V to 3.3V, circuit 200 automatically detects the change and enables additional pulldown device 167 to compensate for the change.

Figure 3:
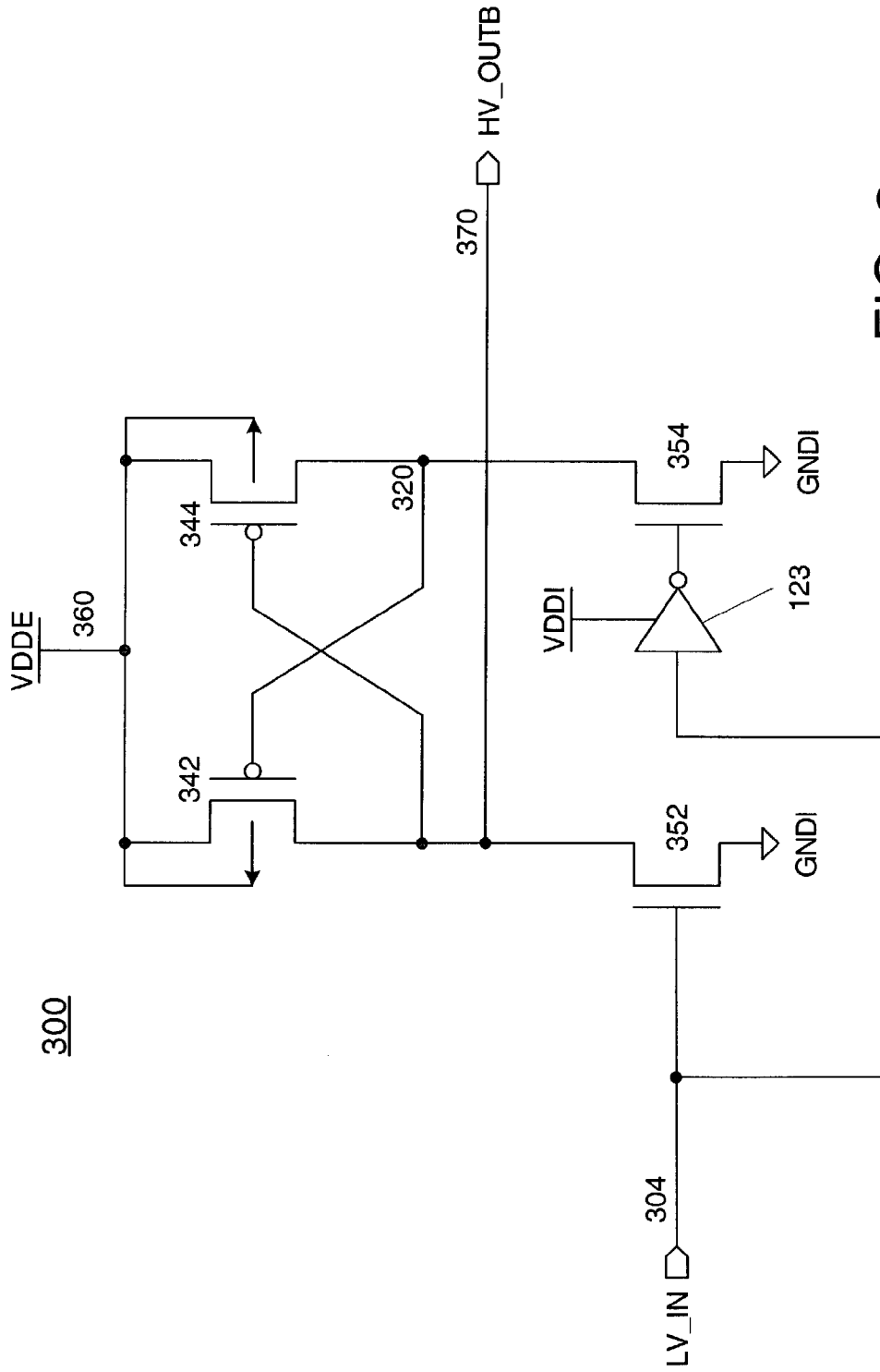
FIG. 3 shows a functional circuit diagram of a prior art level shifter.

FIG. 3 shows an example of a prior art (inverting) level shifter. When the LV_IN input (node 304) is a logic low (0V), NMOS 352 is off and NMOS 354 is on. NMOS 354 pulls node 320 down to GNDI (0V), which turns on PMOS 342. PMOS 342 then pulls node 370 up to the power supply VDDE connected at power pin 360. This ensures that PMOS 344 is off and, since the output HV_OUTB is connected to node 370, that output HV_OUTB is a logic high (VDDE).

When LV_IN is a logic high (VDDI), NMOS 354 is off and NMOS 352 is on. NMOS 352, therefore, pulls node 370 down to GNDI (0V) and causes output HV_OUTB to provide a logic low (0V). In addition, the low voltage at node 370 causes PMOS 344 to turn on and pull node 320 up to VDDE, thereby ensuring that PMOS 342 is off. In summary, when LV_IN is a logic low (0V), HV_OUTB is a logic high (VDDE), and when LV_IN is a logic high (VDDI), HV_OUTB is a logic low (0V). The voltage levels have been shifted from an input range of 0V–VDDI to an output range of 0V–VDDE. Other level shifting circuits will be known to those of ordinary skill in the art.

Figure 4:
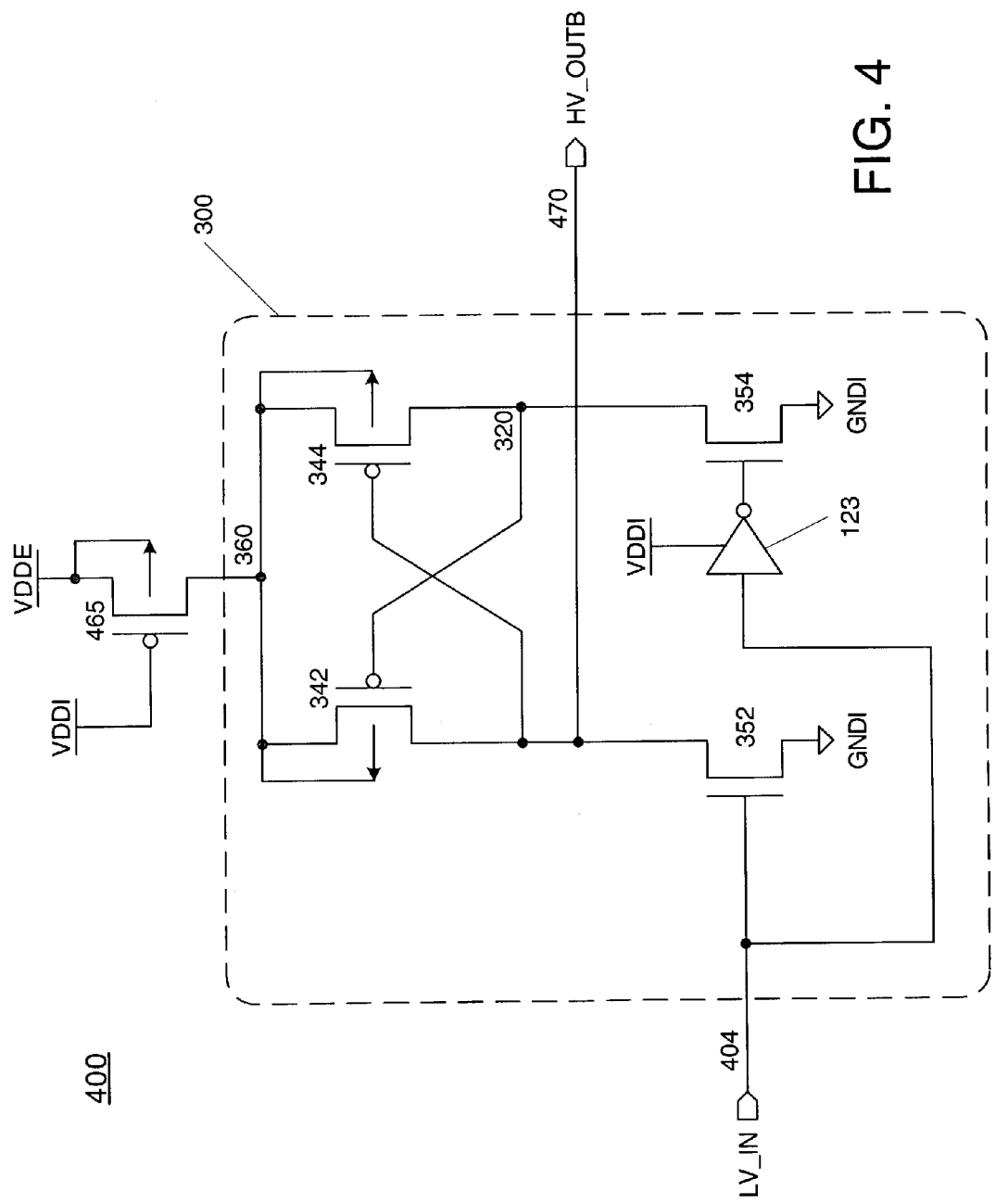
FIG. 4 shows a functional circuit diagram of an auto-detect level shifter.

FIG. 4 shows an example of an auto-detect level shifter in accordance with an embodiment of the present invention. As indicated by the dashed box, most of the circuit is identical to circuit 300. However, in contrast to level shifter circuit 300, the power pin 360 is now connected to the power supply VDDE through an auto-shutoff circuit. The auto-shutoff circuit automatically detects the voltage level of the power supply VDDE and shuts off the connection to the power supply VDDE depending on the detected voltage level. In a preferred embodiment, the auto-detect circuit comprises a PMOS transistor 465. The drain of PMOS 465 is connected to power pin 360 of level shifter circuit 300; the source of PMOS 465 is connected to the power supply VDDE; and the gate of PMOS 465 is connected to VDDI, which serves as a reference voltage.

If the voltage VDDI at the gate of PMOS 465 is equal to the voltage VDDE at its source (i.e., VDDI equals VDDE), PMOS 465 is off, power pin 360 of the level shifter is disconnected from the VDDE power supply, and level shifter circuit 300 is effectively disabled. Since node 360 is now floating, there is no power supply for circuit 300 and, more specifically, there is no power source to pull up output node 470. Once output HV_OUTB reaches 0V (e.g., once the charge at that node, if any, is dissipated) that output must remain at 0V so long as VDDE equals VDDI and circuit 300 is disabled. In circuit 200 of FIG. 2, this means that pulldown device 167 will also remain off, and that only device 157 is used as a pulldown.

If VDDE is greater than VDDI by at least the threshold voltage of PMOS 465, then PMOS 465 is on and conducting. This connects power pin 360 to power supply VDDE, and circuit 300 is enabled and performs level shifting, as is described above with reference to FIG. 3. Pulldown device 167 in FIG. 2 is therefore enabled and is used to speed up the pulldown path of output driver circuit 200.

FIGS. 5A–5D present sample waveforms showing the operation of the auto-detect level shifter when the voltage supply VDDE is changed with various initial conditions. Note that users are not expected to change VDDE on the fly. Normally, the voltage level of VDDE will be established at power-up and will remain constant while the circuit is in use. In such normal cases, the auto-detect level shifter will simply be configured appropriately depending on the voltage supply level that is provided at power up. However, even if the power supply is changed on the fly, the auto-detect level shifter will continue to function properly, as is shown in the waveforms of FIGS. 5A–D and described in greater detail below. This allows a user to change the voltage supply arbitrarily, if desired.

In the example of FIG. 5A, VDDE is increased from 1.8V (i.e., VDDE equal to VDDI) to a higher voltage (in these examples either 2.5V or 3.3V) when the input LV_IN is initially at a logic high. Since VDDE initially equals VDDI, the auto-detect level shifter is off and not connected to the power supply. Output HV_OUTB (node 370) will be discharged and at a logic low (0V) since LV_IN is initially at a logic high and since there is no power supply connected that can possibly pull up node 370. There is no change in HV_OUTB when the power supply VDDE changes, since the logic low voltage level remains the same at 0V. At the next transition of LV_IN to a logic low, HV_OUTB will transition to the new logic high level of 2.5V or 3.3V. In output driver circuit 200, additional pulldown device 167 is enabled and operates to speed up the pulldown path and optimize performance at the new VDDE voltage level.

In the example of FIG. 5B, VDDE is increased when LV_IN is initially at a logic low. Again, output HV_OUTB is initially at a logic low since the VDDE power supply is disconnected. When VDDE is increased to 2.5V/3.3V, the VDDE power supply is connected to the power pin of the level shifter. Node 370 (corresponding to output HV_OUTB) is pulled up to VDDE by PMOS 342, and additional pulldown device 167 is enabled, again providing for optimized performance at the new VDDE voltage level. The level shifter is now enabled and all future transitions at LV_IN result in transitions at HV_OUTB at the shifted voltage range.

In FIGS. 5C and 5D, VDDE is initially greater than VDDI (meaning auto-detect level shifter 250 is enabled) and is subsequently decreased to a voltage level equal to VDDI. In the example of FIG. 5C, LV_IN is initially at a logic high, which causes output HV_OUTB to be pulled to a logic low by NMOS 352. After VDDE is decreased to a voltage level equal to VDDI, HV_OUTB remains at a logic low, regardless of the value of LV_IN, since VDDE is now disconnected from the level shifter, and, therefore, there is no power supply to the level shifter that can pull up node 370. The level shifter is effectively disabled or shut off. The logic low at HV_OUTB means that additional pulldown device 167 remains off and output driver circuit 200 reverts to being optimized for the case where VDDE equals VDDI.

In the example of FIG. 5D, LV_IN is initially at a logic low, which means that output HV_OUTB is at a logic high since it is pulled up to VDDE by PMOS 342. When VDDE is decreased, VDDE is disconnected from the power pin of the level shifter and the level shifter is automatically disabled. However, because there is no path to ground to discharge node 370, HV_OUTB remains at a logic high until the next transition of LV_IN. While HV_OUTB remains at a logic high, additional pulldown device 167 remains enabled and the output of driver circuit 200 remains unbalanced. This condition persists only until the next transition of LV_IN, at which time NMOS 352 is turned on and provides a path to ground that drains the charge from node 370 and pulls output HV_OUTB to a logic low (0V). Thereafter, HV_OUTB remains at a logic low, regardless of the value at LV_IN, since the level shifter is disabled and there is no power supply to pull up node 370. The minor discrepancy before the next LV_IN transition is not a practical problem for several reasons. First, a correct logical result is still obtained, and only a small difference in timing is introduced. Second, as stated above, it is not expected that a user will switch the VDDE power supply on the fly. And third, since the VDDE power supply is being changed, the first transition is necessarily different from all others.

Figure 6:
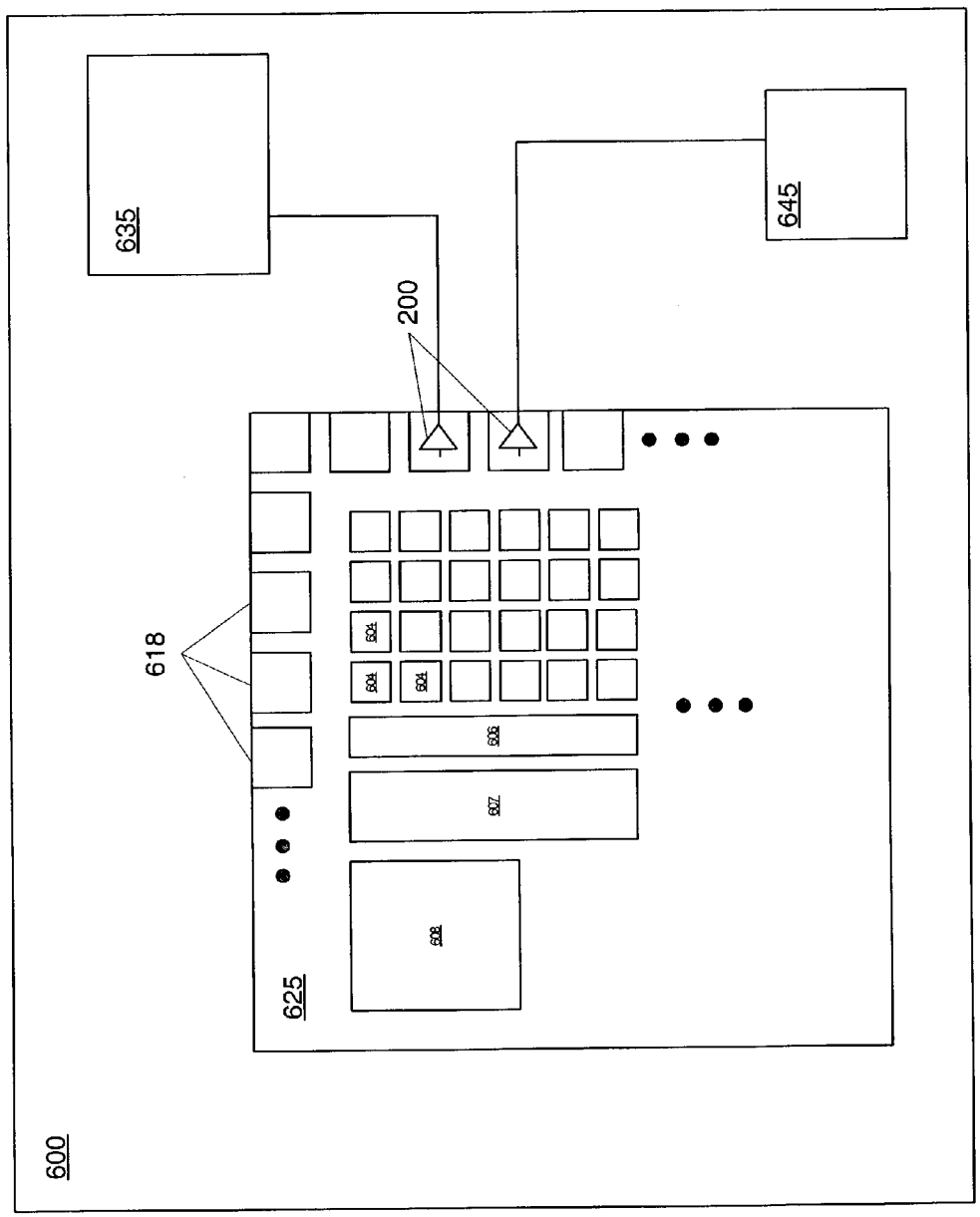
FIG. 6 shows a block diagram of a system in accordance with the present invention.

FIG. 6 shows one example of how an auto-detect level shifter can be integrated into a system. A system 600 can comprise many components, including components 625, 635 and 645. In this example, component 625 is a programmable logic device, such as an FPGA. PLD 625 can include such elements as CLBs 604, multipliers 606, RAM 607, processors 608, and IOBs 618, examples of which are depicted in FIG. 6. These elements can communicate with each other through a programmable interconnect structure (not shown). Some of IOBs 618 can include an output driver circuit 200 that includes an auto-detect level shifter. The output driver circuits can drive outputs from PLD 625 to the other components 635 and 645 in system 600. By incorporating output driver circuit 200 in PLD 625, a user can change the voltage supply to IOBs 618 at any time without compromising performance.

Figure 7:
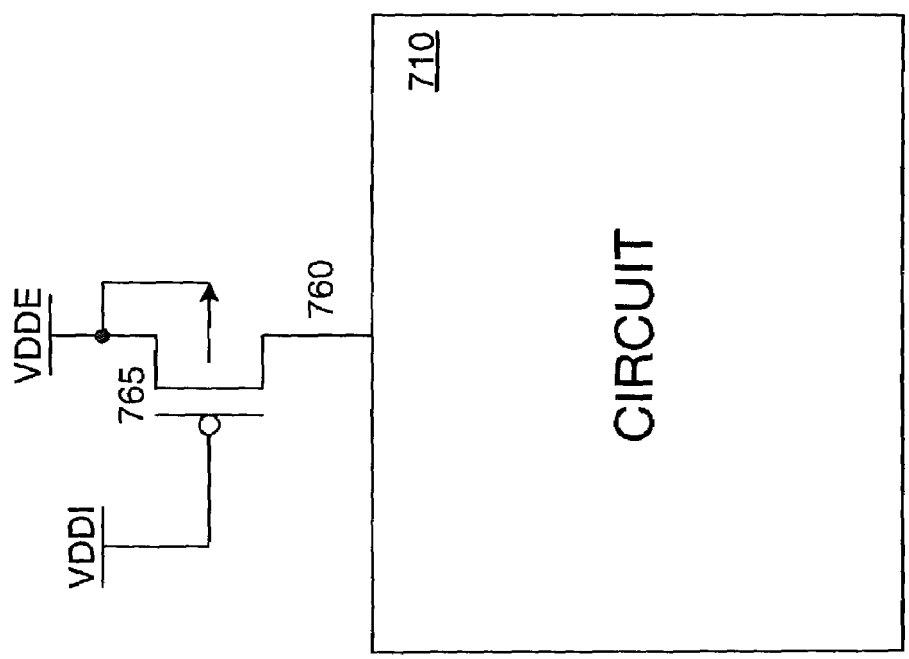
FIG. 7 shows a block diagram of an auto-shutoff circuit in accordance with the present invention.

It will be apparent to one skilled in the art after reading this specification that the present invention can be practiced within these and other architectural variations. For example, the auto-shutoff circuit can be used with many other types of circuits, and is not limited to just a level shifter circuit or an output driver. In FIG. 7, an arbitrary circuit 710 has a power pin 760 that is connected to a power supply VDDE through an auto-shutoff circuit. In one embodiment, the auto-shutoff circuit is a PMOS 765, connected as shown in FIG. 7 with its source connected to VDDE, its drain connected to power pin 760, and its gate connected to a reference voltage VDDI. As with the auto-detect level shifter, when VDDE equals VDDI, the auto-shutoff circuit is off and power pin 760 of circuit 710 is not connected to the power supply. Since there is no power source supplied to circuit 710, it is effectively disabled. If VDDE is greater than VDDI by more than a PMOS threshold voltage, PMOS 765 is on and connects power pin 760 to the VDDE power supply. This supplies power to circuit 710 and automatically enables it. Circuit 710 can be any arbitrary circuit where it would be desirable to have an auto-shutoff feature that depends on the voltage levels of a power supply VDDE and a reference voltage VDDI.

Those having skill in the relevant arts of the invention will now perceive various modifications and additions that can be made as a result of the disclosure herein. For example, the above text describes the circuits and methods of the invention in the context of ICs such as programmable logic devices (PLDs). However, the circuits of the invention can also be implemented in other ICs, including ICs that are not PLDs, and electronic systems.

Further, active-high signals can be replaced with active-low signals and inverting circuits with non-inverting circuits by making straightforward alterations to the circuitry, such as are well known in the art of circuit design. Logical circuits can be replaced by their logical equivalents, as is also well known.

Moreover, some components are shown directly connected to one another while others are shown connected via intermediate components. In each instance the method of interconnection establishes some desired electrical communication between two or more circuit nodes, such as through buffers or other additional logic. Such communication can often be accomplished using a number of circuit configurations, as will be understood by those of ordinary skill in the art.

Accordingly, all such modifications and additions are deemed to be within the scope of the invention, which is to be limited only by the appended claims and their equivalents.

What is claimed is:

1. A multiple voltage output driver comprising:
   an output pad;
   an auto-detect level shifter for automatically detecting an output voltage supplied to the driver, wherein the auto-detect level shifter is selectively enabled depending on the automatically detected output voltage supplied to the driver;
   a first output pulldown device for pulling down the output pad; and
   a second output pulldown device for pulling down the output pad, wherein the second output pulldown device is controlled by an output of the auto-detect level shifter;
   wherein the auto-detect level shifter comprises:
      a level shifter circuit having a power pin; and
      an auto-shutoff circuit coupled between the power pin of the level shifter circuit and the output voltage supplied to the driver.

2. The multiple voltage output driver of claim 1 further comprising:
   an output pullup device for pulling up the output pad, wherein the output pullup device is controlled by an output of a level shifter.

3. The multiple voltage output driver of claim 1 wherein if the output voltage supplied to the driver is greater than a core voltage supplied to the driver, the auto-detect level shifter enables the second output pulldown device.

4. The multiple voltage output driver of claim 1 further comprising:
   a voltage supply for powering the multiple voltage output driver, wherein the voltage supply can take on the value of one of a plurality of voltages.

5. The multiple voltage output driver of claim 1 wherein the driver can be adapted for use with a plurality of I/O standards.

6. The multiple voltage output driver of claim 1 wherein the multiple voltage output driver is incorporated into a programmable logic device.

7. A system comprising:
   a first component;
   a second component, wherein at least one output driver of the second component is coupled to the first component, and wherein the at least one output driver comprises:
      an auto-detect level shifter for automatically detecting a voltage level supplied to the at least one driver, wherein the auto-detect level shifter is selectively enabled depending on the automatically detected voltage level supplied to the at least one driver;
      a first output pulldown device for pulling down an output pad of the at least one output driver; and a second output pulldown device for pulling down the output pad, wherein the second output pulldown device is controlled by an output of the auto-detect level shifter;
wherein the auto-detect level shifter comprises:
a level shifter circuit having a power pin; and
an auto-shutoff circuit coupled between the power pin of the level shifter circuit and the voltage level supplied to the at least one driver.

8. The system of claim 7 further comprising:
a voltage supply for powering the system, wherein the voltage supply can take on the value of one of a plurality of voltages.

9. The multiple voltage output driver of claim 1 wherein the auto-shutoff circuit comprises a transistor coupled between the power pin of the level shifter circuit and the output voltage supplied to the driver.

10. The multiple voltage output driver of claim 9 wherein the transistor is a PMOS transistor.

11. The multiple voltage output driver of claim 10 wherein the PMOS transistor comprises a source terminal, a drain terminal, and a gate terminal, and
wherein the source terminal is coupled to the output voltage supplied to the driver, the drain terminal is coupled to the power pin of the level shifter circuit, and the gate terminal is coupled to a reference voltage.

12. The multiple voltage output driver of claim 7 wherein the auto-shutoff circuit comprises a transistor coupled between the power pin of the level shifter circuit and the voltage level supplied to the at least one driver.

13. The multiple voltage output driver of claim 12 wherein the transistor is a PMOS transistor.

14. The multiple voltage output driver of claim 13 wherein the PMOS transistor comprises a source terminal, a drain terminal, and a gate terminal, and
wherein the source terminal is coupled to the voltage level supplied to the at least one driver, the drain terminal is coupled to the power pin of the level shifter circuit, and the gate terminal is coupled to a reference voltage.

* * * * *